(12) United States Patent
Du

(10) Patent No.: US 9,792,875 B2
(45) Date of Patent: Oct. 17, 2017

(54) GOA CIRCUIT AND DISPLAY PANEL

(71) Applicant: Shenzhen China Star Optoelectronics Technology Co., Ltd., Shenzhen (CN)

(72) Inventor: Peng Du, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 7 days.

(21) Appl. No.: 14/907,827

(22) PCT Filed: Jan. 12, 2016

(86) PCT No.: PCT/CN2016/070623
§ 371 (c)(1),
(2) Date: Jan. 27, 2016

(87) PCT Pub. No.: WO2017/107257
PCT Pub. Date: Jun. 29, 2017

(65) Prior Publication Data
US 2017/0186398 A1   Jun. 29, 2017

(30) Foreign Application Priority Data

Dec. 24, 2015   (CN) .......................... 2015 1 0990551

(51) Int. Cl.
*G09G 5/00*      (2006.01)
*H01L 27/12*     (2006.01)

(52) U.S. Cl.
CPC ........... *G09G 5/003* (2013.01); *H01L 27/124* (2013.01); *H01L 27/1255* (2013.01); *G09G 2300/0809* (2013.01); *G09G 2310/0251* (2013.01); *G09G 2310/06* (2013.01); *G09G 2310/08* (2013.01); *G09G 2330/021* (2013.01)

(58) Field of Classification Search
CPC ........... G09G 5/003; G09G 2300/0809; G09G 2310/0251; G09G 2310/06; G09G 2310/08; G09G 2330/021; H01L 27/124; H01L 27/1255
See application file for complete search history.

(56) References Cited

U.S. PATENT DOCUMENTS

2015/0091887 A1*   4/2015   Ochiai .................. G11C 19/28
345/212

* cited by examiner

*Primary Examiner* — Charles Hicks

(57) ABSTRACT

A GOA circuit located in a display panel is disclosed. The GOA circuit includes a first thin film transistor, a second thin film transistor, a third thin film transistor, a fourth thin film transistor, a fifth thin film transistor, a sixth thin film transistor, a seventh thin film transistor, an eighth thin film transistor, a ninth thin film transistor, a first boost thin film transistor, a second boost thin film transistor, a boost capacitor, a twelfth thin film transistor, a thirteenth thin film transistor, a fourteenth thin film transistor, and a fifteenth thin film transistor. Through the first boost thin film transistor, the second boost thin film transistor, and the boost capacitor, a voltage level of a gate output signal outputted by a gate of the second thin film transistor is lifted.

11 Claims, 2 Drawing Sheets

GOA CIRCUIT AND DISPLAY PANEL

Related Applications

This application is a National Phase of PCT Patent Application No. PCT/CN2016/070623 having International filing date of Jan. 12, 2016, which claims the benefit of priority of Chinese Patent Application No. 201510990551.1 filed on Dec. 24, 2015. The contents of the above applications are all incorporated by reference as if fully set forth herein in their entirety.

Field and Background of the Invention

The present invention relates to a GOA circuit and a display panel, and in particular to a GOA circuit and a display panel using amorphous silicon thin film transistors (TFT).

GOA (Gate-driver On Array) technology is now widely used in display panels, and can reduce the cost of the gate integrated circuit (IC), can reduce the width of the frame of the panel, is advantageous to the currently popular narrow border design, and is a major technology for future panel design.

Typically a boost capacitor is needed to be designed in a GOA circuit using amorphous silicon (Amorphous Silicon, a-Si) thin film transistor, wherein a terminal of the boost capacitor is connected to an output terminal of the gate of the thin film transistor, and the other terminal of the boost capacitor is connected to a gate line corresponding to the GOA circuit. When the GOA circuit outputs a gate pulse, the boost capacitor can lift the voltage level of the gate output terminal, and ensure a normal output of GOA circuit.

However, this design also has a drawback. The boost capacitor is connected to the gate line, when the gate pulse is outputted, the boost capacitor lifts the voltage of the gate output terminal in an aspect, but in another aspect, also becomes a parasitic capacitor of the gate line, whereby a direct consequence thereof is a more severe resist-capacitor (RC) delay of the gate pulse. With a gradual increase of the panel size and the resolution, the load of the gate line is getting bigger, and the existence of the boost capacitor makes this problem more prominent. Thus it is very likely that the charging of the pixel in the panel is not enough, and therefore the display quality of the panel is reduced.

SUMMARY OF THE INVENTION

To solve the aforementioned problem, the present invention redesigns the boost capacitor structure of the GOA circuit, with two thin film transistors to divide the voltage between a device voltage (high potential) VDD and a common ground voltage (low potential) VSS, and connects a dividing point in the middle to a boost capacitor, and uses the change of the voltage level of the dividing point to lift the voltage level of the output terminal of the gate, to achieve the same effect of the design of the existing GOA circuit.

An embodiment of the present invention provides a GOA circuit located in a display panel; the GOA circuit includes a first thin film transistor, a gate of the first thin film transistor connected to a source of the first thin film transistor, and receiving a frequency signal; a second thin film transistor, a source of the second thin film transistor connected to a drain of the first thin film transistor, and a gate of the second thin film transistor outputting a gate output signal; a third thin film transistor, a gate of the third thin film transistor connected to the source of the second thin film transistor, and a source of the third thin film transistor connected to the source of the first thin film transistor; a fourth thin film transistor, a source of the fourth thin film transistor connected to a drain of the third thin film transistor, and a gate of the fourth thin film transistor connected to the gate of the second thin film transistor; a fifth thin film transistor; a sixth thin film transistor, a source of the sixth thin film transistor connected to a drain of the fifth thin film transistor, and a gate of the sixth thin film transistor connected to the source of the fourth thin film transistor; a seventh thin film transistor, a gate of the seventh thin film transistor connected to the gate of the sixth thin film transistor; an eighth thin film transistor, a source of the eighth thin film transistor connected to a gate of the fifth thin film transistor, and a drain of the eighth thin film transistor connected to a drain of the fifth thin film transistor; a ninth thin film transistor, a gate of the ninth thin film transistor connected to a gate of the eighth thin film transistor, and a source of the ninth thin film transistor connected to a source of the seventh thin film transistor; a first boost thin film transistor, a gate of the first boost thin film transistor connected to the source of the ninth thin film transistor, and outputting a gate line output signal; a second boost thin film transistor, a source of the second boost thin film transistor connected to a drain of the first boost thin film transistor at a dividing point, and a gate of the second boost thin film transistor connected to one of the gate of the ninth thin film transistor and a start signal transmitted from a previous stage GOA circuit; a boost capacitor, connected between a drain of the eighth thin film transistor and the dividing point; a twelfth thin film transistor, a source of the twelfth thin film transistor connected to the drain of the eighth thin film transistor; a thirteenth thin film transistor, a gate of the thirteenth thin film transistor connected to the source of the twelfth thin film transistor; a fourteenth thin film transistor, a gate of the fourteenth thin film transistor connected to the gate of the thirteenth thin film transistor, and a drain of the fourteenth thin film transistor connected to the gate of the first boost thin film transistor; and a fifteenth thin film transistor, a source of the fifteenth thin film transistor connected to the drain of the fourteenth thin film transistor, and a gate of the fifteenth thin film transistor connected to a gate of the twelfth thin film transistor.

Preferably, a gate of the second boost thin film transistor is connected to the gate of the ninth thin film transistor.

Preferably, a gate of the second boost thin film transistor is connected to a start signal transmitted from a previous stage GOA circuit.

Preferably, the gate of the second boost thin film transistor receives a control signal transmitted by the display panel, and the control signal controls at least one of the first boost thin film transistor and the second boost thin film transistor to be turned off.

Preferably, when the first boost thin film transistor is turned on, the second boost thin film transistor is turned off, a voltage of the dividing point is a high voltage level, and a voltage level of the gate output signal is lifted through the boost capacitor.

Preferably, when the first boost thin film transistor is turned off, the second boost thin film transistor is turned on, the voltage of the dividing point is a low voltage level, and the voltage level of the gate output signal is not lifted through the boost capacitor.

The boost capacitor in the present invention is not directly connected to the gate line, thus the parasitic capacitor on the gate line is reduced, and the display quality of the panel is improved.

Brief Description of the Several Views of the Drawings

The accompanying drawings are included to provide a further understanding of the invention, and are incorporated in and constitute a part of this specification. The drawings illustrate embodiments of the invention and, together with the description, serve to explain the principles of the invention.

Figure 1:
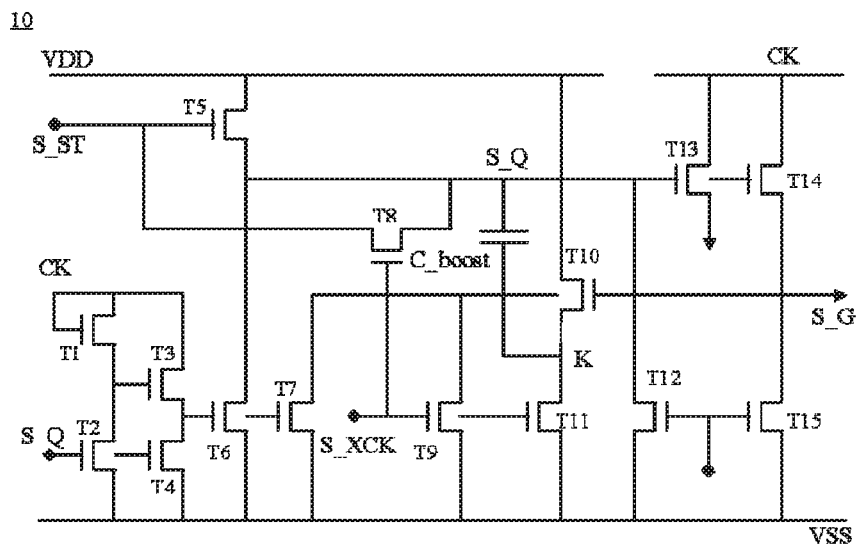
FIG. 1 illustrates a circuit diagram of a GOA circuit according to an embodiment of the present invention.

Description of Specific Embodiments of the Invention

As used in this specification the term "embodiment" means an instance, example, or illustration. In addition, for the articles in this specification and the appended claims, "a" or "an" in general can be interpreted as "one or more" unless specified otherwise or clear from context to determine the singular form.

In the drawings, the same reference numerals denote units with similar structures.

Please refer to FIG. 1, which illustrates a circuit diagram of a GOA circuit according to an embodiment of the present invention. As shown in FIG. 1, a GOA circuit 10 is located in a display panel. The GOA circuit 10 includes a first thin film transistor T1, a gate of the first thin film transistor T1 connected to a source of the first thin film transistor T1, and receiving a frequency signal CK; a second thin film transistor T2, a source of the second thin film transistor T2 connected to a drain of the first thin film transistor T1, and a gate of the second thin film transistor T2 outputting a gate output signal S_Q; a third thin film transistor T3, a gate of the third thin film transistor T3 connected to the source of the second thin film transistor T2, and a source of the third thin film transistor T3 connected to the source of the first thin film transistor T1; a fourth thin film transistor T4, a source of the fourth thin film transistor T4 connected to a drain of the third thin film transistor T3, and a gate of the fourth thin film transistor T4 connected to the gate of the second thin film transistor T2; a fifth thin film transistor T5; a sixth thin film transistor T6, a source of the sixth thin film transistor T6 connected to a drain of the fifth thin film transistor T5, and a gate of the sixth thin film transistor T6 connected to the source of the fourth thin film transistor T4; a seventh thin film transistor T7, a gate of the seventh thin film transistor T7 connected to the gate of the sixth thin film transistor T6; an eighth thin film transistor T8, a source of the eighth thin film transistor T8 connected to a gate of the fifth thin film transistor T5, and a drain of the eighth thin film transistor T8 connected to a drain of the fifth thin film transistor T5; a ninth thin film transistor T9, a gate of the ninth thin film transistor T9 connected to a gate of the eighth thin film transistor T8, and a source of the ninth thin film transistor T9 connected to a source of the seventh thin film transistor T7; a first boost thin film transistor T10, a gate of the first boost thin film transistor T10 connected to the source of the ninth thin film transistor T9, and outputting a gate line output signal S_G; a second boost thin film transistor T11, a source of the second boost thin film transistor T11 connected to a drain of the first boost thin film transistor T10 at a dividing point K, and a gate of the second boost thin film transistor T11 connected to the gate of the ninth thin film transistor T9; a boost capacitor C_boost, connected between a drain of the eighth thin film transistor T8 and the dividing point K; a twelfth thin film transistor T12, a source of the twelfth thin film transistor T12 connected to the drain of the eighth thin film transistor T8; a thirteenth thin film transistor T13, a gate of the thirteenth thin film transistor T13 connected to the source of the twelfth thin film transistor T12; a fourteenth thin film transistor T14, a gate of the fourteenth thin film transistor T14 connected to the gate of the thirteenth thin film transistor T13, and a drain of the fourteenth thin film transistor T14 connected to the gate of the first boost thin film transistor T10; and a fifteenth thin film transistor T15, a source of the fifteenth thin film transistor T15 connected to the drain of the fourteenth thin film transistor T14, and a gate of the fifteenth thin film transistor T15 connected to a gate of the twelfth thin film transistor T12.

The first boost thin film transistor T10 and the second boost thin film transistor T11 are serially connected between the device voltage VDD and the common ground voltage VSS, the gate of the first boost thin film transistor T10 is connected to the corresponding gate line of the current stage GOA circuit 10 (not shown), and the gate of the second boost thin film transistor T11 receives the signal S_XCK. Preferably, the control signal S_XCK controls at least one of the first boost thin film transistor T10 and the second boost thin film transistor T11 to be turned off, thus the current of this branch is kept in a small value, and the power consumption of the GOA circuit is not increased. Preferably, when the first boost thin film transistor T10 is turned on, the second boost thin film transistor T11 is turned off, the voltage of the dividing point K is a high voltage level, and the voltage level of the gate output signal S_Q is lifted through the boost capacitor C_boost, and when the first boost thin film transistor T10 is turned off, the second boost thin film transistor T11 is turned on, the voltage of the dividing point K is a low voltage level, the voltage level of the gate output signal S_Q is not lifted through the boost capacitor C_boost.

As mentioned above, a terminal of the boost capacitor C_boost is connected to the gate output terminal, the other terminal thereof is connected to the dividing point K. When the GOA circuit 10 is normally working, the voltage waveform of the dividing point K is exactly the same as the waveform of the gate line output signal S_G, so when the gate line is outputting, the boost capacitor C_boost is still able to lift the voltage level of the gate output signal S_Q. This new structure design prevents the gate line from being directly connected to the boost capacitor C_boost, thus the load of the gate line is reduced, and the RC delay is reduced, the charge and the display quality of the pixel is improved.

Figure 2:
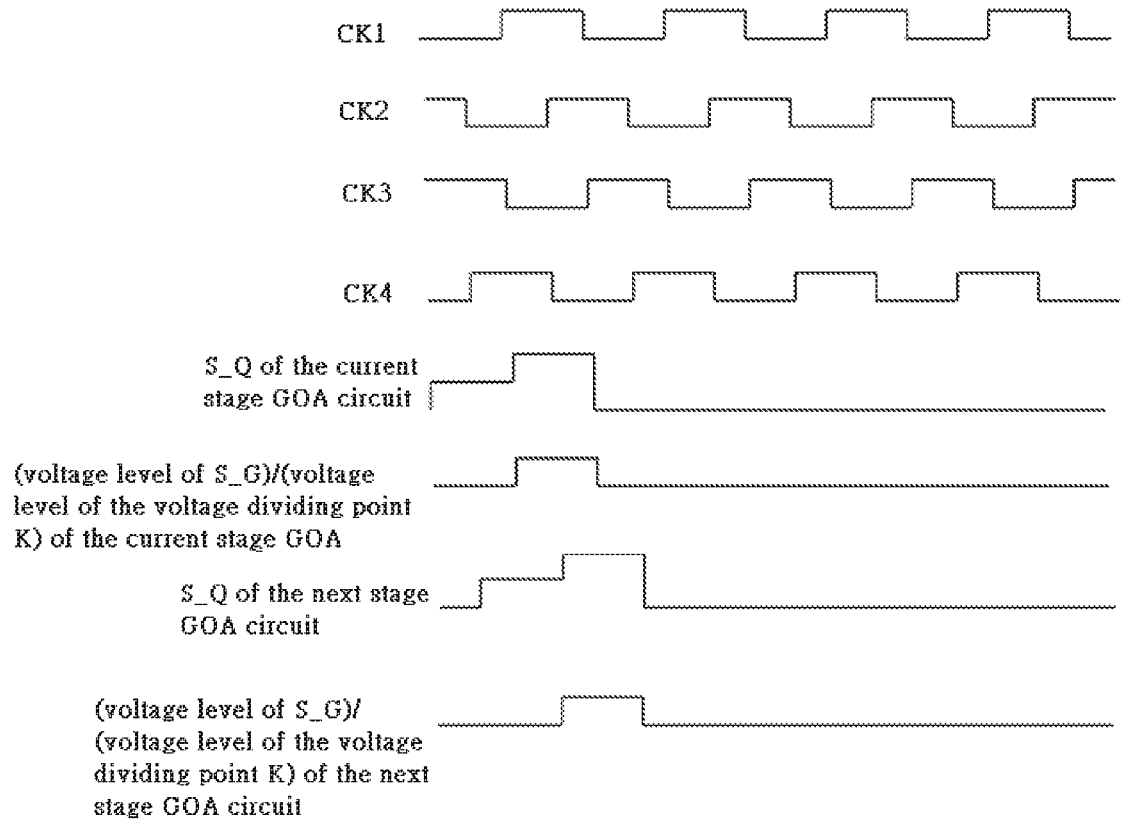
FIG. 2 illustrates a waveform of the normally working GOA circuit in FIG. 1.

Please refer to FIG. 2, which illustrates a waveform of the normally working GOA circuit in FIG. 1. As shown in FIG. 2, the voltage of the dividing point K, in the whole timing of the frequency signals CK1, CK2, CK3, CK4, is a high voltage level only when the current stage gate line outputs the gate line output signal S_G, otherwise the dividing point K is a low voltage level; this is exactly the same as the waveform of the current stage gate line; thus the GOA above can replace the traditional GOA circuit with the gate line connected with the boost capacitor.

Besides, the waveform of the gate output signal S_Q is the same as the waveform of the traditional GOA circuit. When the previous stage GOA circuit (not shown) is turned on, the voltage level of the gate output signal S_Q is lifted for the first time, and when the current stage GOA circuit 10 is outputting, the voltage level of the gate output signal S_Q is lifted for the second time, whereby the normal work of the GOA circuit 10 is ensured. The boost capacitor C_boost is usually designed to be larger, so the improvement of the design is very obvious. Because the parasitic capacitor of the gate line becomes smaller, the waveform of the gate line output signal is closer to an ideal waveform, the charge and display quality of the pixel in the panel are both improved.

Figure 3:
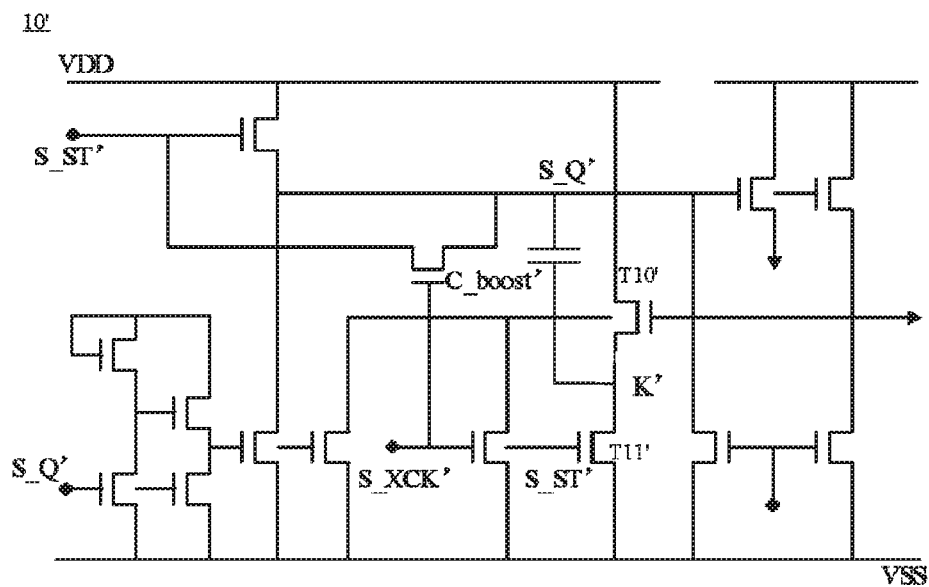
FIG. 3 illustrates a GOA circuit according to another embodiment of the present invention.

Please refer to FIG. 3, which illustrates a GOA circuit 10' according to another embodiment of the present invention. Compared with the GOA circuit 10, the gate of the second boost thin film transistor T11' in FIG. 3 is connected to the start signal S_ST' transmitted from the previous stage GOA circuit (not shown). In this way, at least one of the first boost thin film transistor T10' and the second boost thin film transistor T11' is turned off at any time, and the power consumption of the circuit is ensured to not increase. When the previous stage GOA circuit outputs, the second boost thin film transistor T11' is turned on, the first boost thin film transistor T10' is turned off, and the voltage level of the dividing point K' is a low voltage level. When the current stage GOA circuit 10' outputs, the first boost thin film transistor T10' is turned on, the second boost thin film transistor T11' is turned off, the voltage level of the dividing point K' is a high voltage level, and the dividing point K' can lift the voltage level of the gate output signal S_Q' through the boost capacitor C_boost'. In other time, the voltage levels of the first boost thin film transistor T10' and the second boost thin film transistor T11' are both low voltage levels, the voltage level of the dividing point K' is kept a low voltage level through the pull-down of other pull-down circuit and the coupling of the boost capacitor C_boost'. This design is good at preventing the gate of the second boost thin film transistor T11 from being stressed by the high frequency of the control signal S_XCK', and increasing the circuit dependability.

The boost capacitor in the present invention is not directly connected to the gate line, thus the parasitic capacitor on the gate line is reduced, and the display quality of the panel is improved.

In summary, although the preferable embodiments of the present invention have been disclosed above, the embodiments are not intended to limit the present invention. A person of ordinary skill in the art, without departing from the spirit and scope of the present invention, can make various modifications and variations. Therefore, the scope of the invention is defined in the claims.

What is claimed is:

1. A display panel, comprising a GOA (gate driver on array) circuit, wherein the GOA circuit comprises:
   a first thin film transistor, a gate of the first thin film transistor directly connected to a source of the first thin film transistor, and receiving a frequency signal;
   a second thin film transistor, a source of the second thin film transistor directly connected to a drain of the first thin film transistor, and a gate of the second thin film transistor outputting a gate output signal;
   a third thin film transistor, a gate of the third thin film transistor directly connected to the source of the second thin film transistor, and a source of the third thin film transistor directly connected to the source of the first thin film transistor;
   a fourth thin film transistor, a source of the fourth thin film transistor directly connected to a drain of the third thin film transistor, and a gate of the fourth thin film transistor directly connected to the gate of the second thin film transistor;
   a fifth thin film transistor;
   a sixth thin film transistor, a source of the sixth thin film transistor directly connected to a drain of the fifth thin film transistor, and a gate of the sixth thin film transistor directly connected to the source of the fourth thin film transistor;
   a seventh thin film transistor, a gate of the seventh thin film transistor directly connected to the gate of the sixth thin film transistor;
   an eighth thin film transistor, a source of the eighth thin film transistor directly connected to a gate of the fifth thin film transistor, and a drain of the eighth thin film transistor directly connected to a drain of the fifth thin film transistor;
   a ninth thin film transistor, a gate of the ninth thin film transistor directly connected to a gate of the eighth thin film transistor, and a source of the ninth thin film transistor directly connected to a source of the seventh thin film transistor;
   a first boost thin film transistor, a gate of the first boost thin film transistor directly connected to the source of the ninth thin film transistor, and outputting a gate line output signal;
   a second boost thin film transistor, a source of the second boost thin film transistor directly connected to a drain of the first boost thin film transistor at a dividing point, and a gate of the second boost thin film transistor directly connected to one of the gate of the ninth thin film transistor and a start signal transmitted from a previous stage GOA circuit;
   a boost capacitor, connected between a drain of the eighth thin film transistor and the dividing point;
   a twelfth thin film transistor, a source of the twelfth thin film transistor directly connected to the drain of the eighth thin film transistor;
   a thirteenth thin film transistor, a gate of the thirteenth thin film transistor directly connected to the source of the twelfth thin film transistor;
   a fourteenth thin film transistor, a gate of the fourteenth thin film transistor directly connected to the gate of the thirteenth thin film transistor, and a drain of the fourteenth thin film transistor directly connected to the gate of the first boost thin film transistor; and
   a fifteenth thin film transistor, a source of the fifteenth thin film transistor directly connected to the drain of the fourteenth thin film transistor, and a gate of the fifteenth thin film transistor directly connected to a gate of the twelfth thin film transistor;
   wherein the gate of the second boost thin film transistor receives a control signal transmitted by the display panel.

2. A GOA circuit, located in a display panel, comprising:
   a first boost thin film transistor, a gate of the first boost thin film transistor outputting a gate line output signal;
   a second boost thin film transistor, a source of the second boost thin film transistor directly connected to a drain of the first boost thin film transistor at a dividing point; and
   a boost capacitor, directly connected to the dividing point;
   wherein the gate of the second boost thin film transistor receives a control signal transmitted by the display panel, the control signal controls at least one of the first boost thin film transistor and the second boost thin film transistor to be turned off.

3. The GOA circuit of claim 2, further comprising:
a first thin film transistor, a gate of the first thin film transistor directly connected to a source of the first thin film transistor, and receiving a frequency signal;
a second thin film transistor, a source of the second thin film transistor directly connected to a drain of the first thin film transistor, and a gate of the second thin film transistor outputting a gate output signal;
a third thin film transistor, a gate of the third thin film transistor directly connected to the source of the second thin film transistor, and a source of the third thin film transistor directly connected to the source of the first thin film transistor;
a fourth thin film transistor, a source of the fourth thin film transistor directly connected to a drain of the third thin film transistor, and a gate of the fourth thin film transistor directly connected to the gate of the second thin film transistor;
a fifth thin film transistor;
a sixth thin film transistor, a source of the sixth thin film transistor directly connected to a drain of the fifth thin film transistor, and a gate of the sixth thin film transistor directly connected to the source of the fourth thin film transistor;
a seventh thin film transistor, a gate of the seventh thin film transistor directly connected to the gate of the sixth thin film transistor;
an eighth thin film transistor, a source of the eighth thin film transistor directly connected to a gate of the fifth thin film transistor, and a drain of the eighth thin film transistor directly connected to a drain of the fifth thin film transistor;
a ninth thin film transistor, a gate of the ninth thin film transistor directly connected to a gate of the eighth thin film transistor, and a source of the ninth thin film transistor directly connected to a source of the seventh thin film transistor;
a twelfth thin film transistor, a source of the twelfth thin film transistor directly connected to the drain of the eighth thin film transistor;
a thirteenth thin film transistor, a gate of the thirteenth thin film transistor directly connected to the source of the twelfth thin film transistor;
a fourteenth thin film transistor, a gate of the fourteenth thin film transistor directly connected to the gate of the thirteenth thin film transistor, and a drain of the fourteenth thin film transistor directly connected to the gate of the first boost thin film transistor; and
a fifteenth thin film transistor, a source of the fifteenth thin film transistor directly connected to the drain of the fourteenth thin film transistor, and a gate of the fifteenth thin film transistor directly connected to a gate of the twelfth thin film transistor.

4. The GOA circuit of claim 3, wherein a gate of the second boost thin film transistor is directly connected to the gate of the ninth thin film transistor.

5. The GOA circuit of claim 3, wherein a gate of the second boost thin film transistor is directly connected to a start signal transmitted from a previous stage GOA circuit.

6. The GOA circuit of claim 5, wherein when the first boost thin film transistor is turned on, the second boost thin film transistor is turned off, a voltage of the dividing point is a high voltage level, and a voltage level of the gate output signal is lifted through the boost capacitor.

7. The GOA circuit of claim 5, wherein when the first boost thin film transistor is turned off, the second boost thin film transistor is turned on, the voltage of the dividing point is a low voltage level, the voltage level of the gate output signal is not lifted through the boost capacitor.

8. A display panel, comprising a GOA circuit, wherein the GOA circuit comprises:
a first thin film transistor, a gate of the first thin film transistor directly connected to a source of the first thin film transistor, and receiving a frequency signal;
a second thin film transistor, a source of the second thin film transistor directly connected to a drain of the first thin film transistor, and a gate of the second thin film transistor outputting a gate output signal;
a third thin film transistor, a gate of the third thin film transistor directly connected to the source of the second thin film transistor, a source of the third thin film transistor directly connected to the source of the first thin film transistor;
a fourth thin film transistor, a source of the fourth thin film transistor directly connected to a drain of the third thin film transistor, a gate of the fourth thin film transistor directly connected to the gate of the second thin film transistor;
a fifth thin film transistor;
a sixth thin film transistor, a source of the sixth thin film transistor directly connected to a drain of the fifth thin film transistor, a gate of the sixth thin film transistor directly connected to the source of the fourth thin film transistor;
a seventh thin film transistor, a gate of the seventh thin film transistor directly connected to the gate of the sixth thin film transistor;
an eighth thin film transistor, a source of the eighth thin film transistor directly connected to a gate of the fifth thin film transistor, a drain of the eighth thin film transistor directly connected to a drain of the fifth thin film transistor;
a ninth thin film transistor, a gate of the ninth thin film transistor directly connected to a gate of the eighth thin film transistor, a source of the ninth thin film transistor directly connected to a source of the seventh thin film transistor;
a first boost thin film transistor, a gate of the first boost thin film transistor directly connected to the source of the ninth thin film transistor, and outputting a gate line output signal;
a second boost thin film transistor, a source of the second boost thin film transistor directly connected to a drain of the first boost thin film transistor at a dividing point, a gate of the second boost thin film transistor directly connected to one of the gate of the ninth thin film transistor and a start signal transmitted from a previous stage GOA circuit;
a boost capacitor, connected between a drain of the eighth thin film transistor and the dividing point;
a twelfth thin film transistor, a source of the twelfth thin film transistor directly connected to the drain of the eighth thin film transistor;
a thirteenth thin film transistor, a gate of the thirteenth thin film transistor directly connected to the source of the twelfth thin film transistor;
a fourteenth thin film transistor, a gate of the fourteenth thin film transistor directly connected to the gate of the thirteenth thin film transistor, a drain of the fourteenth thin film transistor directly connected to the gate of the first boost thin film transistor; and a fifteenth thin film transistor, a source of the fifteenth thin film transistor directly connected to the drain of the fourteenth thin film transistor, a gate of the fifteenth thin film transistor directly connected to a gate of the twelfth thin film transistor.

9. The display panel of claim 8, wherein the gate of the second boost thin film transistor receives a control signal transmitted by the display panel, the control signal controls at least one of the first boost thin film transistor and the second boost thin film transistor to be turned off.

10. The display panel of claim 9, wherein when the first boost thin film transistor is turned on, the second boost thin film transistor is turned off, a voltage of the dividing point is a high voltage level, and a voltage level of the gate output signal is lifted through the boost capacitor.

11. The display panel of claim 9, wherein when the first boost thin film transistor is turned off, the second boost thin film transistor is turned on, the voltage of the dividing point is a low voltage level, the voltage level of the gate output signal is not lifted through the boost capacitor.

* * * * *